US007547876B2

(12) United States Patent
Flaherty

(10) Patent No.: US 7,547,876 B2
(45) Date of Patent: Jun. 16, 2009

(54) PHOTOCONTROL DEVICES AND METHODS FOR FORMING THE SAME

(75) Inventor: Richard Charles Flaherty, Fuquay Varina, NC (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/895,194

(22) Filed: Aug. 23, 2007

(65) Prior Publication Data

US 2009/0050785 A1 Feb. 26, 2009

(51) Int. Cl.
*H01L 27/14* (2006.01)
*G01J 1/44* (2006.01)

(52) U.S. Cl. .................. 250/239; 250/214 AL
(58) Field of Classification Search .......... 250/205, 250/239, 214 AL; 362/4, 5, 276
See application file for complete search history.

(56) References Cited

U.S. PATENT DOCUMENTS

| | | | |
|---|---|---|---|
| 2,533,987 A | 12/1950 | Bahr | |
| 2,673,336 A | 3/1954 | Peters | |
| 2,978,591 A | 4/1961 | Ringger, Jr. | |
| 3,379,892 A | 4/1968 | Neagle | |
| 3,504,107 A | 3/1970 | Wagner et al. | |
| 3,541,496 A | 11/1970 | Castellani | |
| 4,500,158 A | 2/1985 | Dola | |
| 4,653,834 A | 3/1987 | Norden | |
| 4,774,613 A | 9/1988 | Okita et al. | |
| 4,964,818 A | 10/1990 | Weatherley | |
| 5,065,283 A | 11/1991 | Adachi et al. | |
| 6,313,456 B1 * | 11/2001 | Miyashita et al. ........ 250/208.1 |
| 6,663,405 B1 | 12/2003 | Robinson et al. | |
| 6,663,422 B1 | 12/2003 | Robinson et al. | |
| 6,997,739 B2 | 2/2006 | Hoxha | |
| 2004/0110413 A1 | 6/2004 | Brandstatter et al. | |
| 2005/0055172 A1 | 3/2005 | Flaherty | |
| 2005/0266716 A1 | 12/2005 | Hoxha | |

FOREIGN PATENT DOCUMENTS

| | | |
|---|---|---|
| DE | 1283331 B | 11/1968 |
| EP | 0398088 A | 11/1990 |
| JP | 4069527 | 3/1992 |

OTHER PUBLICATIONS

"Ready Reference Guide, Photo controls and Light Products", http://energy.tycoelectronics.com/rrg/alr_rrg/mainindex.pdf, Copyright 2001, Tyco Electronics.
Declaration of Richard Flaherty under 37 C.F.R. §1.132 dated Aug. 20, 2007.
Declaration of Chrisitne Cole under 37 C.F.R. §1.132 dated Aug. 21, 2007.

* cited by examiner

*Primary Examiner*—Stephen Yam

(57) ABSTRACT

A photocontrol device includes a housing assembly and a flexible circuit board assembly. The housing assembly defines an enclosure cavity. The flexible circuit board assembly includes a flexible substrate and a photocontrol circuit mounted on the flexible substrate. The circuit board assembly is disposed in the enclosure cavity in a bent position.

17 Claims, 3 Drawing Sheets

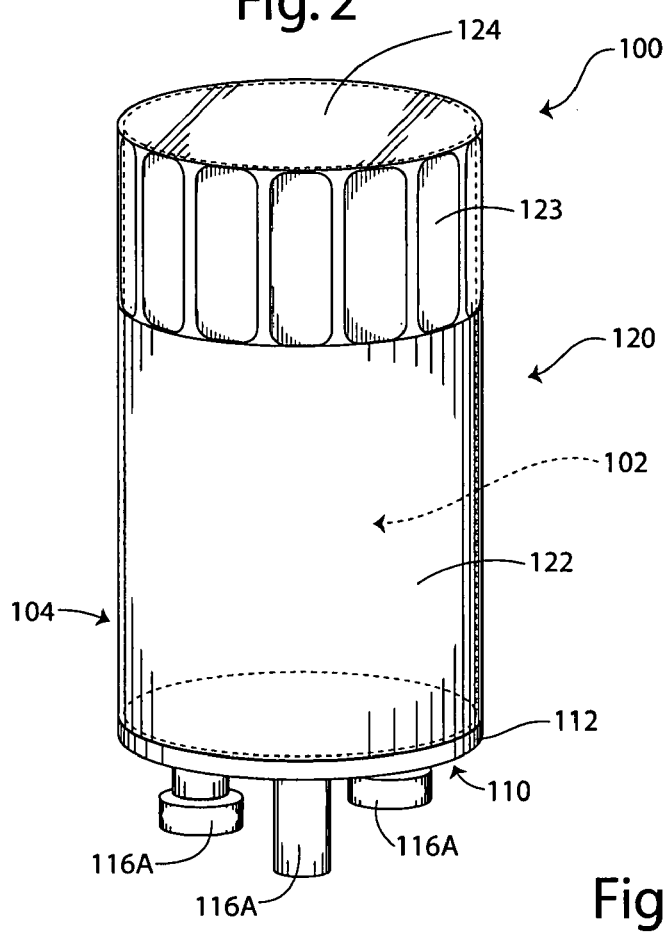
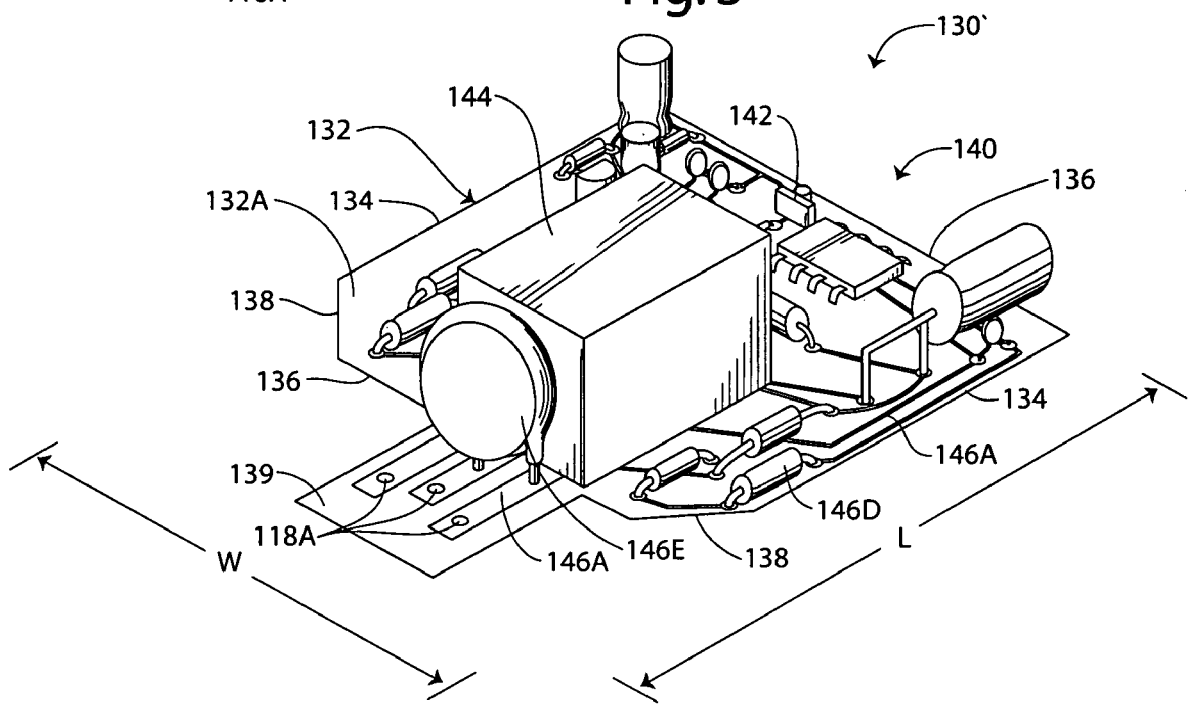

PHOTOCONTROL DEVICES AND METHODS FOR FORMING THE SAME

BACKGROUND OF THE INVENTION

The present invention relates to control devices and, more particularly, to photocontrol devices and methods of forming the same.

Photocontrol devices are used in a variety of applications where it is desirable to provide a control signal responsive to detection of a light level. One common application of such photocontrol devices is in the detection of ambient light levels. In particular, photocontrol devices may be used to detect the transition from daylight to night so that lights may be turned on for security, safety and/or aesthetic reasons. For example, street lights are generally provided with photocontrol devices to turn on the street lights at dusk. Examples of such photocontrol devices include the Model ALR 1000, 2000, and 6000 series of photocontrols available from Tyco Electronics Corporation. Such a device may include a switch mode power converter of relatively high voltage alternating current to relatively low voltage direct current. Light may be detected by a photocontrol transistor and the electric impulses therefrom may be analyzed by various circuit components having a programmable reference level. The transistor may further operate as a switch (ON/OFF), based on a preset value corresponding to the intensity of detected light passing from day to night and vice-versa.

SUMMARY OF THE INVENTION

According to some embodiments of the present invention, a photocontrol device includes a housing assembly and a flexible circuit board assembly. The housing assembly defines an enclosure cavity. The flexible circuit board assembly includes a flexible substrate and a photocontrol circuit mounted on the flexible substrate. The circuit board assembly is disposed in the enclosure cavity in a bent position.

According to further embodiments of the present invention, a lighting system includes a lighting fixture and a photocontrol device. The lighting fixture includes a lamp and a photocontroller connector. The photocontrol device is operatively connected to the photocontroller connector and includes a housing assembly and a flexible circuit board assembly. The housing assembly defines an enclosure cavity. The flexible circuit board assembly includes a flexible substrate and a photocontrol circuit mounted on the flexible substrate. The circuit board assembly is disposed in the enclosure cavity in a bent position. The photocontrol device is operative to control the lighting fixture based on light incident on the photocontrol device.

According to some method embodiments of the present invention, a method for manufacturing a photocontrol device includes: constructing a flexible circuit board assembly including a flexible substrate and a photocontrol circuit mounted on the flexible substrate; bending the circuit board into a bent position; and placing the circuit board assembly in the bent position into an enclosure cavity of a housing assembly.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

FIG. 2 is a top perspective view of the photocontrol device of FIG. 1.

FIG. 3 is a perspective view of a flexible circuit board assembly forming a part of the photocontrol device of FIG. 1 in a flat position.

DETAILED DESCRIPTION OF EMBODIMENTS OF THE INVENTION

Figure 1:
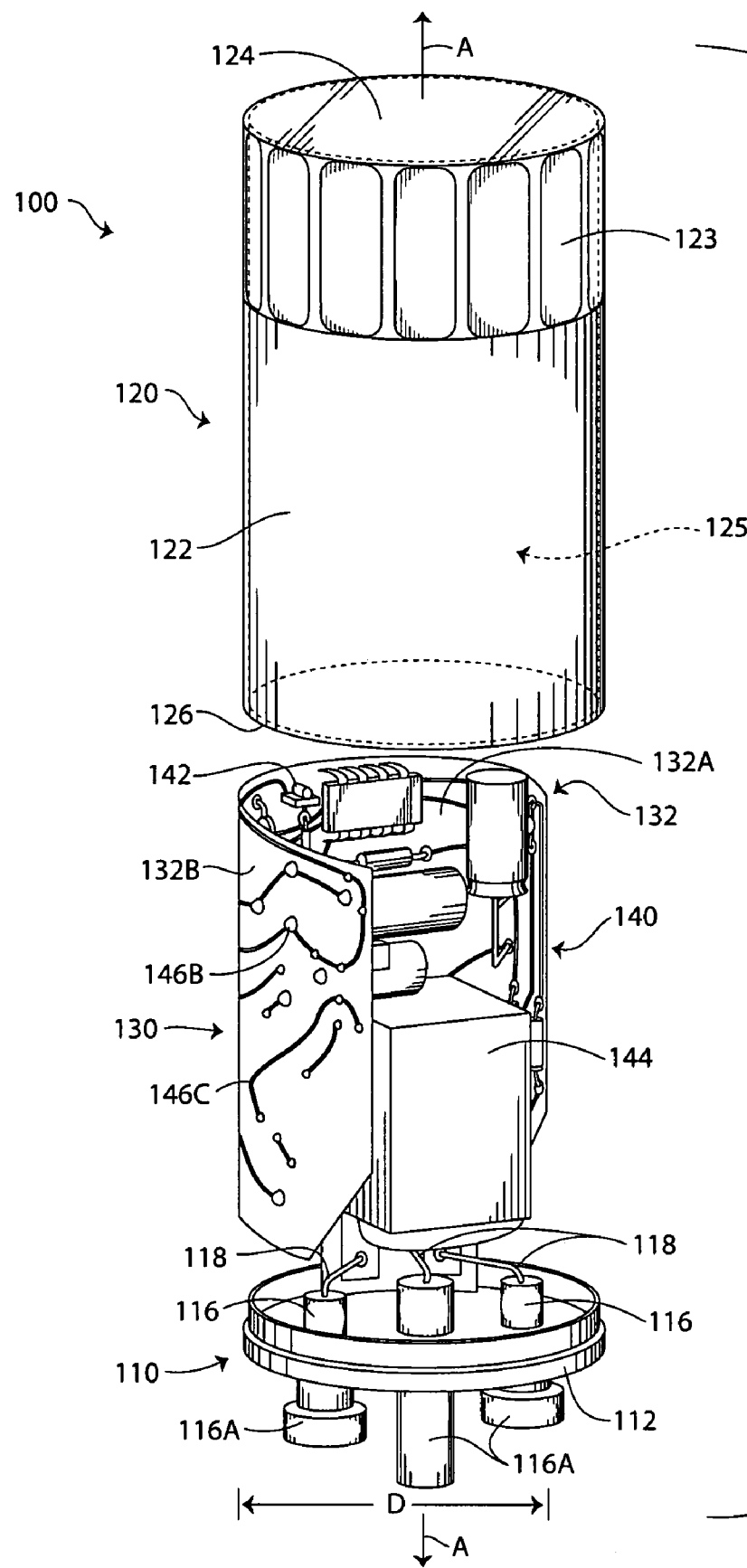
FIG. 1 is an exploded, top perspective view of a photocontrol device according to some embodiments of the present invention.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art. Well-known functions or constructions may not be described in detail for brevity and/or clarity.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or. "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "bend" means to deflect or force an article to assume a curved or angular shape, and "bent" refers to such an article. "Bending" may include rolling, curling, folding, wrapping and the like. Likewise, a "bent" article may have a rolled, curled, folded, wrapped or the like configuration.

Figure 4:
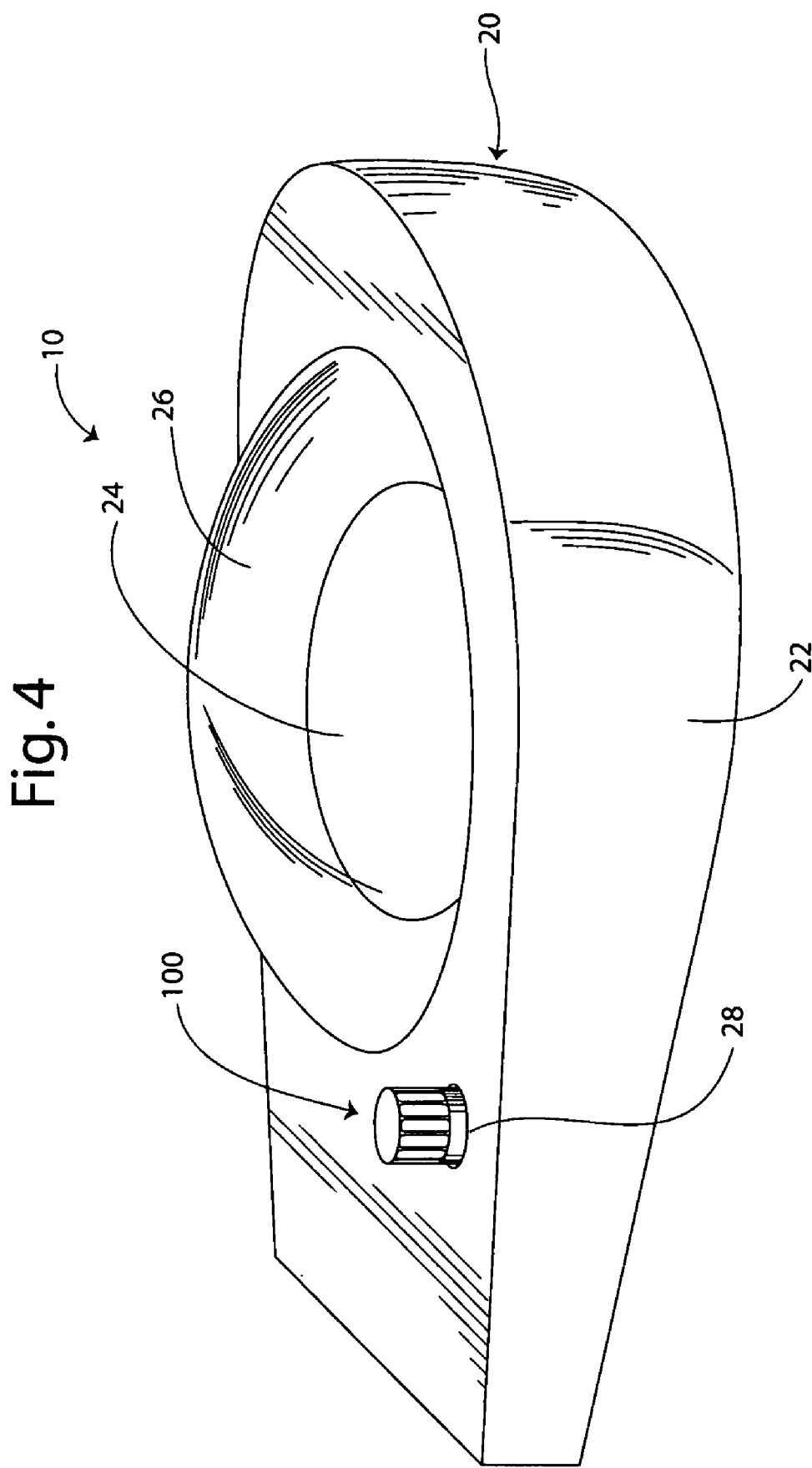
FIG. 4 is a perspective view of a lighting system including the photocontrol device of FIG. 1.

Embodiments of the present invention will now be described with reference to the various embodiments illustrated in FIGS. 1-4. FIG. 1 is an exploded, top perspective view of a photocontrol device 100 according to some embodiments of the present invention. FIG. 2 is a top perspective view of the photocontrol device 100 fully assembled. According to some embodiments, the photocontrol device 100 is operably installed in a lighting device, such as a light fixture 20 to form a lighting system 10 as shown in FIG. 4. In the illustrated embodiments, the photocontrol device 100 includes a base assembly 110 and a mating cover 120 that together form a housing assembly 104. The housing assembly 104 defines an enclosure cavity 102 (FIG. 2) wherein a flexible circuit board assembly 130 is enclosed. The photocontrol device 100 may be a modular unit.

The base assembly 110 includes a body 112 (e.g., a base plate). Contact members 116 (e.g., contact pins) extend through the body 112, such that contact portions 116A extend outwardly from the bottom of the body 112. Leads 118 or other electrical connectors extend from the inner ends of the contact members 116. According to some embodiments, the leads 118 are semi-rigid wires that are bendable but capable of retaining their shape in the absence of outside force. The body 112 may be formed of a polymeric material, such as polybutylene terephthalate. The contact members 116 and the leads 118 may be formed of a suitable electrically conductive material such as brass.

The cover 120 as illustrated includes a cylindrical side wall 122 and an end wall 124 defining a cavity 125 and an opening 126 communicating with the cavity 125. At least a portion of the end wall 124 or the sidewall 122 is light transmissive. The cover 120 may be formed of a polymeric material, such as ultraviolet (UV) resistant polypropylene. According to some embodiments, the cover 120 is unitarily molded. An opaque heat shrink wrap 123 may surround a portion of the side wall 122 adjacent the end wall 124 to block light from entering from the side of the photocontrol device.

The circuit board assembly 130 is shown in its bent position in FIG. 1 and in a flat position 130', as discussed below, in FIG. 3. The circuit board assembly 130, 130' includes a flexible circuit board substrate 132 and a photocontrol electrical circuit 140 mounted, at least in part, on the substrate 132. According to some embodiments, at least a portion of the photocontrol circuit 140 is printed on the flexible substrate 132 (i.e., the circuit board assembly 130, 130' is a flexible printed circuit board). The electrical circuit 140 may embody a detection and switching circuit.

The flexible substrate 132 has a front side 132A and a rear side 132B. The substrate 132 has opposed side edges 134, opposed end edges 136, angled lower corner edges 138, and an extended lower flap 139. The substrate 132 may be formed of any suitable flexible material or film. Suitable materials may include polyamide and/or polyester. According to some embodiments, the substrate 132 has a tensile strength of between about 20,000 and 24,000 psi. According to some embodiments, the substrate 132 has a dielectric strength of between about 3000 and 6000 AC volts/mil. According to some embodiments, the substrate 132 has a thickness in the range of from about 0.3 to 15 mils and, according to some embodiments, in the range of from about 0.3 to 5 mils.

The electrical circuit 140 may include various electrical components including a photosensor 142 and a switching device 144. The switching device 144 is illustrated as a relay in FIGS. 1 and 3. The circuit 140 may comprise further components such as copper traces 146A, solder pads 146B, insulated wires 146C, resistors 146D, capacitors 146E, etc. (FIGS. 1 and 3) The electrical circuit 140 may be configured so that the detection of light by the photosensor 142 activates or deactivates the relay 144. The relay 144 may, in turn, be coupled through the contact members 116 to an associated light source, such as the light fixture 20 (FIG. 4) that may be turned on or off responsive to the state of the relay 144. It will be understood by those of skill in the art that various conventional detection elements may be used to couple the photosensor 142 to the switching device 144. For example, a comparator may be provided as a detection element in a detection circuit. The comparator may be an analog comparator having a reference voltage and/or may be a digital circuit having a programmable reference level.

As illustrated, the photosensor 142 and the relay 144 may be mounted on the front side 132A of the substrate 132. These components, as well as the other circuit components, may be applied to or mounted on the flexible substrate 132 using any suitable technique. The substrate 132 may include multiple layers of electrically insulating material. For example, according to some embodiments, the substrate includes two film layers laminated together and the circuit 140 includes copper traces or other components that are sandwiched or interposed between the film layers. The substrate 132 may include a protective conformal coating on one or both sides. According to some embodiments, only solder connections, wires and traces are mounted on the rear side 132B of the substrate 132, and the larger, three-dimensional electrical components (e.g., resistors, capacitors, the photosensor 142 and the relay 144) of the circuit 140 are mounted on the front side 132A. Holes may be formed through the substrate 132 to permit electrical connections on the rear side 132B.

The circuit board assembly 130 is connected to the base assembly 110 by the leads 118 at respective connection points 118A (FIG. 3). According to some embodiments, the leads 118 are soldered to the circuit board assembly 130. According to some embodiments, the leads 118 serve as legs or posts that mechanically couple the circuit board assembly 130 to the base assembly 110 and electrically connect the circuit 140 to the contact members 116. According to some embodiments, the leads 118 are sufficiently strong and stiff to support the circuit board assembly 130 but are bendable to allow repositioning of the circuit board assembly 130 relative to the base assembly 110.

The construction of the photocontrol device 100 may be further appreciated from the following description of methods for forming the photocontrol device 100 in accordance with some embodiments of the invention.

The flexible circuit board assembly 130, 130' may be manufactured in a flat position. FIG. 3 shows the circuit board assembly 130 in its premounted, flat position as a flat printed circuit board assembly 130'. The circuit board assembly 130' may be formed using any suitable technique and construction. For example, a copper trace may be formed on a flexible substrate film layer (e.g., using a silk screen printing, photoengraving, PCB milling, etc. technique). A further flexible substrate film layer may be laminated onto the first layer over the copper trace or a conformal coating may be applied (e.g., by dipping or spraying) to protect the copper trace and/or other components. Holes or vias may be drilled through the substrate 132. Pads or lands may be plated on the substrate 132. Line art and/or text may be printed (e.g., by silk screening) on the substrate 132. Components, such as the photosensor 142, the relay 144, etc., may be mounted on the substrate (e.g., using through hole solder mounting and/or surface mounting techniques).

According to some embodiments, the width W of the substrate 132 (FIG. 3) is between about 1.5 and 2 inches. According to some embodiments, the length L (FIG. 3) of the substrate 132 is between about 1.5 and 2 inches.

The circuit board assembly 130 is mounted on the leads 118 and the base assembly 110. According to some embodiments, the circuit board assembly 130 is first joined to the leads 118 and the leads 118 are thereafter joined to the contact members 116. Alternatively, the leads 118 can be joined to the contact members 116 and thereafter to the circuit board assembly 130. The leads 118 can be joined to the contact members 116 by soldering, for example. The leads 118 can be joined to the circuit board assembly 130 by any suitable technique. According to some embodiments, the leads 118 are connected to the circuit board assembly 130 by through hole solder mounting.

Before or after mounting the circuit board assembly 130 on the base assembly 110, the circuit board assembly 130' is bent into a bent position. According to some embodiments, the circuit board assembly 130 is bent into a curved shape as its bent position. According to some embodiments, and as shown, the flat circuit board assembly 130' is rolled up about a roll axis A-A (FIG. 1) from the flat circuit board assembly 130' to the bent position of the circuit board assembly 130 as shown in FIG. 1. As illustrated, the substrate 132 is collapsed radially inwardly so that the various circuit components may be brought into closer proximity to one another. The layout of the circuit 140 may be configured to facilitate space efficient nesting of the circuit components. The size and shape of the enclosure cavity 102 can be selected to accommodate the circuit board assembly 130 when the circuit board assembly 130 is bent to a position that will not cause breakage of the circuit 140, but such that the enclosure cavity 102 would not accommodate the circuit board assembly 130 in its flat position. The circuit board assembly 130 as bent or rolled may be generally cylindrical or semi-cylindrical (i.e., generally C-shaped in cross-section) and the substrate 132 may be self-overlapping.

Once the circuit board assembly 130 has been rolled up, the circuit board assembly 130 is inserted or slid through the opening 126 of the cover 120 and into the cavity 125 until the cover 120 mates with the base assembly 110. According to some embodiments, the opening 126 is closed by the body 112 so that the circuit board assembly 130 is fully enclosed or encapsulated in the cavity 102. According to some embodiments, the photosensor 142 is positioned adjacent the end wall 124 to receive light therethrough. The cover 120 and the base body 112 may have complementary interlocking features to secure them to one another in this position. The cover 120 and the base 110 may form a sealed unit. When released, the circuit board assembly 130 may radially expand to engage the inner surface of the cover side wall 122. According to some embodiments, the inner surface of the side wall 122 is generally cylindrical and substantially complementary to the circuit board assembly 130.

According to some embodiments, the outer diameter D of the rolled or bent circuit board assembly 130 in the finally assembled photocontrol device 100 is between about 0.8 and 1.0 inch. According to some embodiments, the outer diameter D is no more than 318 percent of the width W of the flat circuit board assembly 130'. According to some embodiments, the radius of curvature of the rolled substrate 132 of the circuit board assembly 130 is between about 0.4 and 0.5 inch.

With reference to FIG. 4, the photocontrol device 100 can be used with the light fixture 20 as follows. The light fixture 20 includes a housing 22, a lamp 24, a cover 26 enclosing the lamp 24, and a photocontrol device receptacle 28. The light fixture 20 includes suitable circuitry and a power source, such as an alternating current (AC) power source, to illuminate the lamp 24. The photocontrol device 100 is mounted in the receptacle 28, such that the contact members 116 operatively engage mating electrical connectors of the light fixture 20. The photocontrol device 100 may serve to close and interrupt the supply of power to the lamp 24.

In use, the light transmissive end wall 124 of the cover 120 allows ambient light to reach the photosensor 142 where it is detected by the detection circuit 140. The photocontrol device 100 may thereby control the operation of the light fixture 20 according to the calibration of the photocontrol device 100. For example, the electric impulses from the photosensor 142 may be analyzed by various circuit components having a programmable reference level. The relay 144 may further operate as a switch (ON/OFF), based on a preset value corresponding to the intensity of detected light passing from day to night and vice-versa, for example. Thus, according to some embodiments, when light having at least a predetermined intensity is incident on the photosensor 142, the photocontrol device 100 will switch the light fixture 20 off so that the lamp 24 is not illuminated. When the light incident on the photosensor 142 is below a specified intensity, the photocontrol device 100 will switch the light fixture 20 on so that the lamp 24 is illuminated. Hysteresis may be provided in suitable levels. The photocontrol device 100 may also be a switch mode power converter of relatively high voltage alternating current to relatively low voltage direct current. According to some embodiments, the photocontrol device 100 can be removed and replaced in the receptacle 28.

Photocontrol devices according to some embodiments of the present invention may provide a number of advantages. Because the circuit board assembly is flexible, the flexible substrate can be laid flat during manufacture, allowing standard and/or other preferred production practices to be employed. The flexible circuit board may allow greater ease of assembly, design flexibility and modifiability, as well as reduced cost.

The cylindrical shape of the bent circuit board assembly 130 in some embodiments permits the circuit board assembly 130 to fit into the cylindrically shaped enclosure cavity 102. This may allow for a smaller overall form factor and/or a preferred shape for the photocontrol device 100.

Heat transfer to the outside of the enclosure housing assembly 104 can be enhanced or optimized by the resulting placement of the components of the circuit 140 in contact or close proximity to the wall(s) of the housing assembly 104 (e.g., the side wall 122). This may result in cooler circuit operation, which may provide longer service life and more reliable operation.

Various modifications may be made in accordance with further embodiments of the present invention. For example, the circuit board assembly 130 can be mounted on the base assembly 110 in another manner (e.g., using rigid posts, which can be integral with the body 112). The base assembly may include a cavity to receive the circuit board assembly 130, and this cavity may be in place of or in addition to the cavity 125 of the cover 120. The cover 120 may include an aperture or window (not shown) to allow ambient light to reach the photosensor 142.

Flexible circuit board assemblies having various other circuit designs and/or flexible substrate configurations may be provided as desired. According to some embodiments, the circuit board assembly may be bent, rolled or folded into a shape other than the generally cylindrical shape as illustrated. For example, the circuit board assembly may be bent into a generally S-shaped configuration.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A photocontrol device comprising:
   a housing assembly including an outer wall and defining an enclosure cavity, wherein the outer wall has an inner surface, the inner surface defining at least a portion of the enclosure cavity; and
   a flexible circuit board assembly including a flexible substrate and a photocontrol circuit mounted on the flexible substrate, wherein the circuit board assembly is disposed in the enclosure cavity in a bent position wherein the circuit board assembly has a generally cylindrical shape;
   wherein the inner surface of the outer wall has a generally cylindrical shape substantially complementary to the generally cylindrical shape of the bent circuit board assembly, and the circuit board assembly engages the inner surface of the outer wall to promote heat transfer from the circuit board assembly.

2. The photocontrol device of claim 1 wherein the photocontrol circuit includes a photosensor mounted on the flexible substrate.

3. The photocontrol device of claim 1 wherein the photocontrol circuit includes a switching device mounted on the flexible substrate.

4. The photocontrol device of claim 3 wherein the switching device includes a relay.

5. The photocontrol device of claim 1 wherein at least a portion of the photocontrol circuit is printed on the flexible substrate.

6. The photocontrol device of claim 1 wherein the housing assembly includes a base assembly including a body and at least one contact member adapted to electrically connect the photocontrol device with a lighting device.

7. The photocontrol device of claim 6 wherein the circuit board assembly is coupled to the base assembly by at least one lead extending from the at least one contact member to the circuit board assembly.

8. The photocontrol device of claim 7 wherein the at least one lead is bendable and semi-rigid.

9. The photocontrol device of claim 6 including a cover mounted on the base assembly.

10. The photocontrol device of claim 9 wherein the cover defines a cover cavity forming at least a part of the enclosure cavity and the circuit board assembly is disposed in the cover cavity.

11. The photocontrol device of claim 10 wherein the cover includes a light transmissive wall, the photocontrol circuit includes a photosensor mounted on the flexible substrate, and the photosensor is positioned adjacent the light transmissive wall to receive light therethrough.

12. The photocontrol device of claim 1 wherein the flexible substrate has a tensile strength of between about 20,000 and 24,000 psi.

13. The photocontrol device of claim 1 wherein the flexible substrate comprises a material selected from the group consisting of polymide and polyester.

14. The photocontrol device of claim 1 wherein the circuit board assembly has a generally circular or semi-circular cylindrical shape.

15. A lighting system comprising:
   a lighting fixture including a lamp and a photocontroller connector; and
   a photocontrol device operatively connected to the photocontroller connector, the photocontrol device comprising:
      a housing assembly including an outer wall and defining an enclosure cavity wherein the outer wall has an inner surface, the inner surface defining at least a portion of the enclosure cavity; and
      a flexible circuit board assembly including a flexible substrate and a photocontrol circuit mounted on the flexible substrate, wherein the circuit board assembly is disposed in the enclosure cavity in a bent position wherein the circuit board assembly has a generally cylindrical shape;
      wherein the inner surface of the outer wall has a generally cylindrical shape substantially complementary to the generally cylindrical shape of the bent circuit board assembly, and the circuit board assembly engages the inner surface of the outer wall to promote heat transfer from the circuit board assembly;
   wherein the photocontrol device is operative to control the lighting fixture responsive to light incident on the photocontrol device.

16. A method for manufacturing a photocontrol device, the method comprising:
   constructing a flexible circuit board assembly including a flexible substrate and a photocontrol circuit mounted on the flexible substrate;
   bending the circuit board into a bent position wherein the circuit board assembly has a generally cylindrical shape; and
   placing the circuit board assembly in the bent position into an enclosure cavity of a housing assembly, the housing assembly including an outer wall having an inner surface defining at least a portion of the enclosure cavity and having a generally cylindrical shape substantially complementary to the generally cylindrical shape of the bent circuit board assembly, including engaging the circuit board assembly with the inner surface of the outer wall to promote heat transfer from the circuit board assembly.

17. The method of claim 16 including, after placing the circuit board assembly in the bent position into the enclosure cavity, releasing the circuit board assembly to permit the circuit board assembly to radially expand to engage the inner surface of the outer wall.

* * * * *